(12) United States Patent
Chen

(10) Patent No.: US 11,452,040 B2
(45) Date of Patent: Sep. 20, 2022

(54) METHOD AND APPARATUS FOR IDENTIFYING ELECTRONIC DEVICE, TERMINAL DEVICE, AND ELECTRONIC DEVICE

(71) Applicant: BEIJING XIAOMI MOBILE SOFTWARE CO., LTD., Beijing (CN)

(72) Inventor: Jianli Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 307 days.

(21) Appl. No.: 16/833,520

(22) Filed: Mar. 28, 2020

(65) Prior Publication Data

US 2021/0168717 A1 Jun. 3, 2021

(30) Foreign Application Priority Data

Nov. 29, 2019 (CN) .......................... 201911204789.1

(51) Int. Cl.
| | |
|---|---|
| *G06F 11/22* | (2006.01) |
| *H04W 52/02* | (2009.01) |
| *H04L 25/06* | (2006.01) |
| *G01R 27/26* | (2006.01) |
| *H03K 5/1534* | (2006.01) |

(52) U.S. Cl.
CPC .... *H04W 52/0229* (2013.01); *G01R 27/2605* (2013.01); *G06F 11/221* (2013.01); *H04L 25/069* (2013.01); *H03K 5/1534* (2013.01)

(58) Field of Classification Search
CPC ........... H04W 52/0229; G01R 27/2605; H04L 25/069; H03K 5/1534; G06F 11/221

USPC ......................................................... 358/520
See application file for complete search history.

(56) References Cited

U.S. PATENT DOCUMENTS

| | | |
|---|---|---|
| 2007/0106828 A1 | 5/2007 | Kelley |
| 2011/0087818 A1 | 4/2011 | Kelley |
| 2018/0024899 A1* | 1/2018 | Degura ................. G06F 11/221 358/520 |

FOREIGN PATENT DOCUMENTS

| | | |
|---|---|---|
| CN | 104461568 A | 3/2015 |
| CN | 104503762 A | 4/2015 |
| CN | 104936099 A | 9/2015 |
| CN | 106445862 A | 2/2017 |
| WO | 2018045687 A1 | 3/2018 |

OTHER PUBLICATIONS

Supplementary European Search Report in the European application No. 20171541.4, dated Sep. 30, 2020.
First Office Action of the Chinese application No. 201911204789.1, dated Oct. 16, 2020.

* cited by examiner

*Primary Examiner* — Abdul-Samad A Adediran
(74) *Attorney, Agent, or Firm* — Syncoda LLC; Feng Ma

(57) ABSTRACT

A method for identifying electronic device is applied to a terminal device and includes: sending, in response to receiving a power-on signal of the electronic device, a detection signal to the electronic device; acquiring waveform information of the detection signal; and determining a type of the electronic device according to the waveform information.

18 Claims, 7 Drawing Sheets

METHOD AND APPARATUS FOR IDENTIFYING ELECTRONIC DEVICE, TERMINAL DEVICE, AND ELECTRONIC DEVICE

CROSS-REFERENCE TO RELATED APPLICATION

This application claims priority to Chinese Patent Application No. 201911204789.1 filed on Nov. 29, 2019, the disclosure of which is hereby incorporated by reference in its entirety.

BACKGROUND

A terminal device such as a mobile phone is provided with an interface (for example, a Type C interface). The terminal device cooperates with an external electronic device through the interface. With the development of science and technology, types of electronic devices cooperating with the terminal device become more and more.

SUMMARY

The present disclosure relates to the technical field of device identification, and more specifically to a method and apparatus for identifying electronic device, a terminal device, and an electronic device.

In a first aspect of embodiments of the present disclosure, there is provided a method for identifying electronic device. The method may be applied to a terminal device. The method may include:

sending, in response to receiving a power-on signal of the electronic device, a detection signal to the electronic device;

acquiring waveform information of the detection signal; and determining a type of the electronic device according to the waveform information.

In a second aspect of the present disclosure, there is provided an apparatus for identifying electronic device. The apparatus may be applied to a terminal device. The apparatus may include:

a sending portion, configured to send, in response to receiving a power-on signal of the electronic device, a detection signal to the electronic device;

an acquiring portion, configured to acquire waveform information of the detection signal; and a determining portion, configured to determine a type of the electronic device according to the waveform information.

In a third aspect of the present disclosure, there is provided a terminal device. The terminal device may cooperate with an electronic device. The terminal device may include:

a processor; and a memory configured to store instructions executable for the processor.

The processor may be configured to:

send, in response to receiving a power-on signal of the electronic device, a detection signal to the electronic device;

acquire waveform information of the detection signal; and determine a type of the electronic device according to the waveform information.

In a fourth aspect of the present disclosure, there is provided an electronic device. The electronic device may be configured to cooperate with the terminal device which is provided in the above third aspect. The electronic device may include: a characteristic capacitor and a first pin which is connected to the characteristic capacitor, the first pin being configured to receive the detection signal sent by the terminal device.

BRIEF DESCRIPTION OF THE DRAWINGS

The accompanying drawings referred to in the specification are a part of this disclosure, and provide illustrative embodiments consistent with the disclosure and, together with the detailed description, serve to illustrate some embodiments of the disclosure.

DETAILED DESCRIPTION

Figure 1:
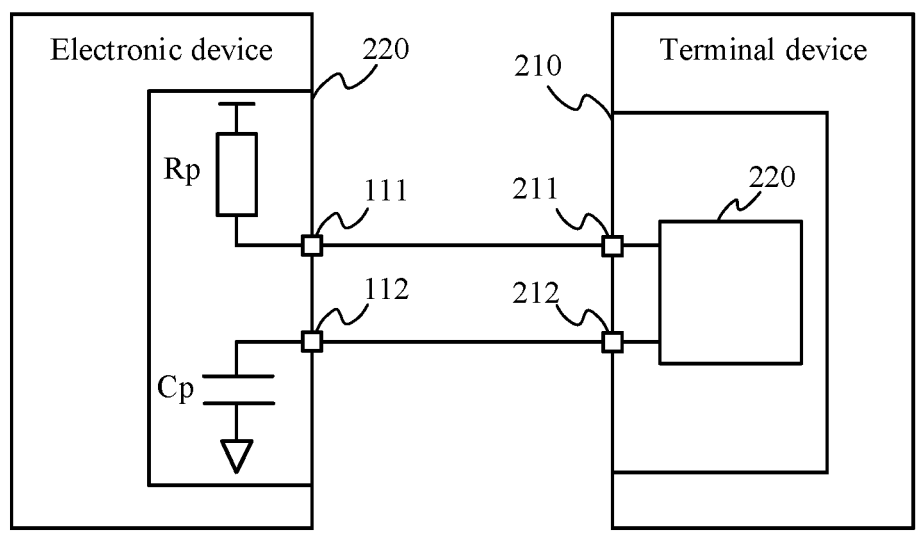
FIG. 1 is a schematic connection diagram illustrating an electronic device and a terminal device, according to some embodiments of the present disclosure.

Exemplary embodiments (examples of which are illustrated in the accompanying drawings) are elaborated below. The following description refers to the accompanying drawings, in which identical or similar elements in two drawings are denoted by identical reference numerals unless indicated otherwise. The exemplary implementation modes may take on multiple forms, and should not be taken as being limited to examples illustrated herein. Instead, by providing such implementation modes, embodiments herein may become more comprehensive and complete, and comprehensive concept of the exemplary implementation modes may be delivered to those skilled in the art. Implementations set forth in the following exemplary embodiments do not represent all implementations in accordance with the subject disclosure. Rather, they are merely examples of the apparatus and method in accordance with certain aspects herein as recited in the accompanying claims.

The terms used in the present disclosure are for the purpose of describing particular embodiments only, and are not intended to limit the present disclosure. Unless otherwise defined, technical terms or scientific terms used in the present disclosure should be understood in the ordinary meaning of those of ordinary skill in the art to which the disclosure pertains. Similar words "a" or "an" and the like used in the specification and claims of the present disclosure do not denote a quantity limitation, but mean that there is at least one. Unless otherwise specified, similar words "comprise" or "include" and the like mean that elements or objects preceding "comprise" or "include" encompass listed elements or objects following "comprise" or "include" and their equivalents, and do not exclude other elements or objects. Similar words "connect" or "connected" and the like are not limited to physical or mechanical connections, and may include electrical connections, whether direct or indirect.

"A/an", "the" and "this" in a singular form in the specification of the present disclosure and the appended claims are also intended to include a plural form, unless other meanings are clearly denoted throughout the present disclosure. It is also to be understood that term "and/or" used in the present disclosure refers to and includes one or any or all possible combinations of multiple associated items that are listed.

Typically, a terminal device and an electronic device are connected through an interface (for example, a Type C interface) to implement energy or data transmission between the terminal device and the electronic device. However, due to the limitation of an interface circuit, the types of electronic devices that can be identified by the terminal device are limited, which makes it difficult to meet use requirements.

The electronic device includes a first interface. A first pin and a second pin are provided in the first interface. In addition, the first pin and the second pin are connected to a characteristic resistor. The terminal device includes a second interface. A third pin and a fourth pin are provided in the second interface. In addition, the terminal device also has an interface chip which is connected to the third pin and the fourth pin.

When the terminal device is connected to the electronic device, the first interface is connected to the second interface. The first pin is connected to the third pin, and the second pin is connected to the fourth pin. Accordingly, the interface chip of the terminal device is connected to the characteristic resistor of the electronic device. Further, the terminal device determines a type of the electronic device by identifying, through the interface chip, the characteristic resistor which is connected to the first pin and the second pin.

However, the adoption of this manner is subjected to the circuit limitation of the interface chip in the terminal device, and there are fewer types of electronic devices that can be identified by the terminal device. With more and more types of electronic devices, it is difficult for the methods in the related art to meet use requirements.

Based on the foregoing, the embodiments of the present disclosure provide a method for identifying electronic device and apparatus, and an electronic device.

Figure 2:
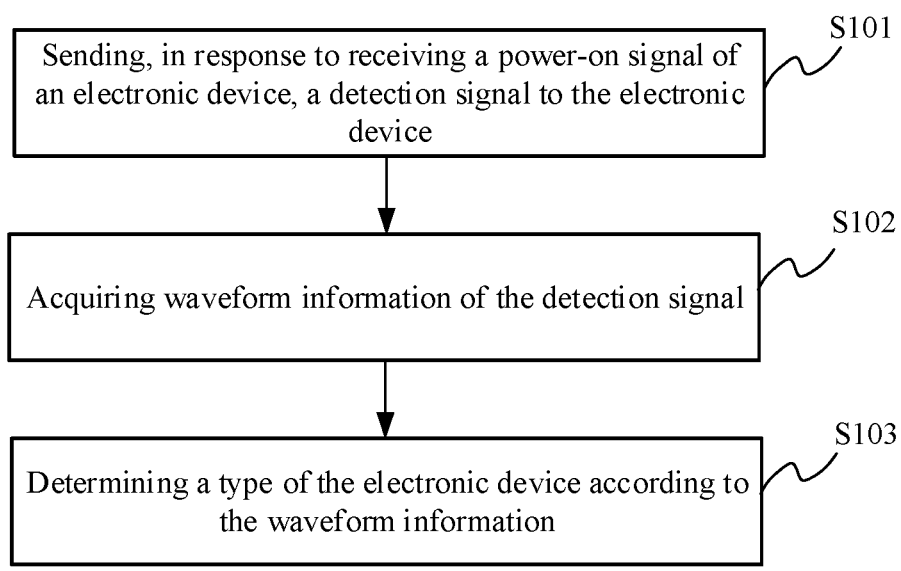
FIG. 2 is a schematic flowchart showing a method for identifying electronic device, according to some embodiments of the present disclosure.

FIG. 1 is a schematic connection diagram illustrating an electronic device and a terminal device, according to some embodiments of the present disclosure. FIG. 2 is a flowchart showing a method for identifying electronic device, according to some embodiments of the present disclosure.

Before introducing the method provided by the embodiment of the present disclosure, a manner of connecting an electronic device and a terminal device is described first. As shown in FIG. 1, the electronic device includes a first interface 110. A first pin 111 and a second pin 112 are provided in the first interface 110. The first pin 110 is connected to a pull-up resistor Rp, and the second pin 112 is connected to a characteristic capacitor Cp.

In some embodiments, the electronic device provided in the embodiment of the present disclosure is a portable charging apparatus, such as a mobile power supply and a charging back clip. The first interface 110 is a Type C interface.

The terminal device includes a second interface 210 and an interface chip 220. A third pin 211 and a fourth pin 212 which are connected to the interface chip 220 are provided in the second interface 210.

When the electronic device is connected to the terminal device, the first interface 110 is connected to the second interface 210. The first pin 111 is connected to the third pin 211, and the second pin 112 is connected to the fourth pin 212.

The method for identifying electronic device provided by the embodiment of the present disclosure is applied to a terminal device. As shown in FIG. 1, the identification method specifically includes the following operations.

In S101, in response to receiving a power-on signal of the electronic device, a detection signal is sent to the electronic device.

In some embodiments, in conjunction with FIG. 1, after the electronic device is connected to the terminal device, the interface chip 220 of the terminal device is electrically connected to the pull-up resistor Rp of the first pin 111 in the electronic device through the third pin 211. Accordingly, in S101, it is determined, by detecting the pull-up resistor Rp through the interface chip 220, that the power-on signal of the electronic device is received by the terminal device.

After the power-on signal of the electronic device is received by the terminal device, a detection signal is sent to the electronic device. In some embodiments, with reference to FIG. 1, after the terminal device is connected to the electronic device, the fourth pin 212 of the terminal device is connected to the second pin 112 of the electronic device. In such a case, the terminal device sends the detection signal to the electronic device through the interface chip 220 via the fourth pin 212 and the second pin 112.

In S102, waveform information of the detection signal is acquired.

The waveform information of the detection signal is related to a load of a pin, which receives the detection signal, in the electronic device. Specifically, the different performances of the loads of the pin, which receives the detection signal, in the electronic device results in different waveform changes in the detection signal which is output by the terminal device. That is, the detection signal has different waveform information.

With reference to FIG. 1, the second pin 112 in the electronic device is connected to the fourth pin 212 of the terminal device, and the second pin 112 is connected to the characteristic capacitor Cp. In addition, the terminal device sends a detection signal to the second pin 112 of the electronic device through the fourth pin 212. In such a case, by providing different characteristic capacitors Cp in the electronic device, the detection signal output by the terminal device has different waveform information.

In some embodiments, the detection signal includes a square wave signal. In such a case, in S102, acquiring the waveform information of the detection signal specifically includes: acquiring a rising edge time and/or a falling edge time of the detection signal. That is, the waveform information includes the rising edge time and/or the falling edge time. In some embodiments, the terminal device acquires the rising edge time and/or the falling edge time of the detection signal through the interface chip 220.

In S103, a type of the electronic device is determined according to the waveform information.

Due to different pin loads in the electronic device, the detection signal has different waveform information. Therefore, there is correspondences between waveform information and load types. Further, by providing different pin loads in different types of electronic devices, waveform information and types of electronic devices have the correspondences.

In such a case, a first correspondence table may be optionally stored in the terminal device in advance. The first correspondence table records the correspondences between waveform information and types of electronic devices. The terminal device determines the type of the electronic device through the first correspondence table according to the current waveform information.

Figure 3:
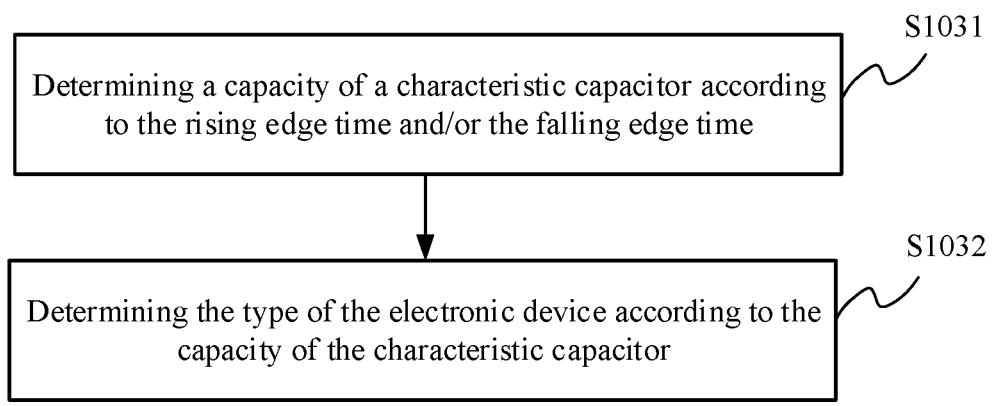
FIG. 3 is a schematic flowchart showing a method for identifying electronic device, according to some embodiments of the present disclosure.

FIG. 3 is a method flowchart showing S103 in a method for identifying electronic device, according to some embodiments of the present disclosure. In some embodiments, as shown in FIG. 3, S103 specifically includes the following operations.

In S1031, a capacity of the characteristic capacitor is determined according to the rising edge time and/or the falling edge time.

Due to different capacities of the characteristic capacitor $C_p$, the detection signal has different rising edge times and/or falling edge times. At this time, the first correspondence table stored in the terminal device in advance includes a correspondence between a rising edge time and/or a falling edge time and a capacitor capacity. Further, the terminal device searches for the corresponding capacitor capacity through the first correspondence table according to the current rising edge time and/or falling edge time.

Figure 4:
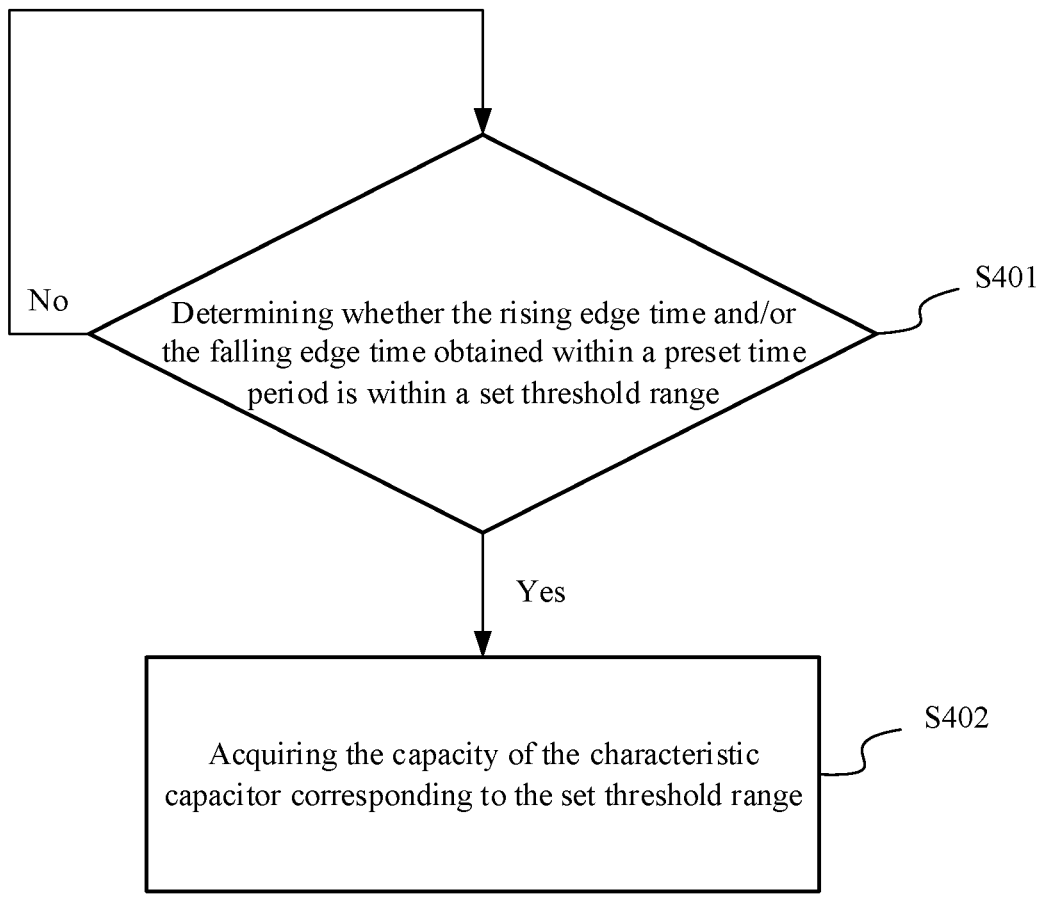
FIG. 4 is a schematic flowchart showing a method for identifying electronic device, according to some embodiments of the present disclosure.

The embodiment of the present disclosure provides a specific implementation manner of S1031. FIG. 4 is a method flowchart showing S1031 in a method for identifying electronic device, according to some embodiments of the present disclosure.

In some embodiments, as shown in FIG. 4, S1031 specifically includes the following operations.

In S401, it is determined whether the rising edge time and/or the falling edge time obtained within a preset time period is within a set threshold range.

If the determination result of S401 is that the rising edge time and/or the falling edge time obtained within a preset time period is not within a set threshold range, S401 is repeatedly performed. If the determination result of S401 is that the rising edge time and/or the falling edge time obtained within a preset time period is within a set threshold range, S402 is performed.

In S402, a capacity of the characteristic capacitor corresponding to the set threshold range is acquired.

In some embodiments, in the first correspondence table of the terminal device, a capacity of the characteristic capacitor corresponds to a rising edge duration range and/or a falling edge duration range. Accordingly, when the terminal device receives the power-on signal of the electronic device, the terminal device sends a square wave signal to the electronic device. Within a preset time period (1 s, 2 s, 3 s, etc.), the terminal device determines that the length of the rising edge time and/or the falling edge time of the square wave signal is within a set threshold range, which indicates that the electronic device is indeed connected to the terminal device.

In this way, the electronic device is accurately identified as being actually connected to the terminal device, and the electronic device is avoided from being identified in the case that the electronic device and the terminal device are connected and disconnected momentarily. Further, unnecessary information transmission or information processing is reduced, and energy consumption of the terminal device is reduced.

In S1032, a type of the electronic device is determined according to the capacity of the characteristic capacitor.

Different characteristic capacitors are provided in different electronic devices. For example, a characteristic capacitor with a capacity of 1 µF is provided in the first type of electronic device (for example, a charging back clip). A characteristic capacitor with a capacity of 1 nF is provided in the second type of electronic device (for example, a power bank).

In some embodiments, a second correspondence table is stored in the terminal device in advance. The second correspondence table records correspondences between capacities of characteristic capacitors and types of electronic devices. The terminal device searches for a corresponding type of electronic device through the second correspondence table according to the currently obtained capacity of the characteristic capacitor.

By the method for identifying electronic device provided by the embodiment of the present disclosure, the terminal device can identify different types of electronic devices. In addition, the manner of identifying a type of an electronic device according to waveform information of a detection signal avoids increasing the circuit complexity of an interface chip in a terminal device. Therefore, by the method for identifying electronic device provided by the embodiment of the present disclosure, the types of electronic devices that can be identified can be enriched on the premise of avoiding increasing the hardware cost of the terminal device.

Figure 5:
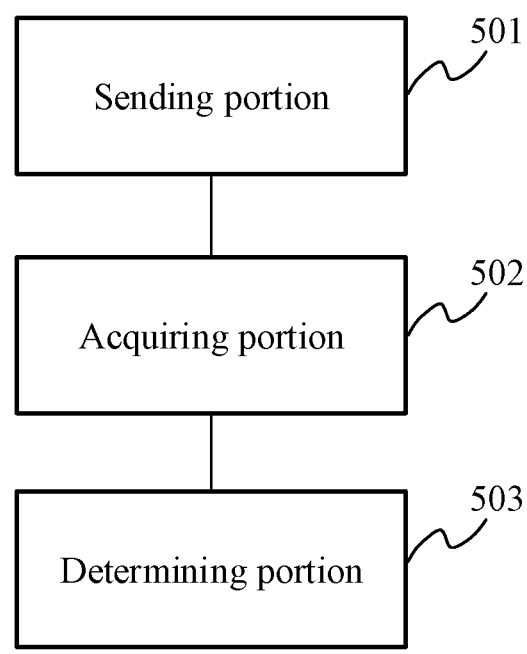
FIG. 5 is a block diagram illustrating an apparatus for identifying electronic device, according to some embodiments of the present disclosure.

In a second aspect, based on the above method for identifying electronic device, an embodiment of the present disclosure provides an apparatus for identifying electronic device. The apparatus is applied to a terminal device. FIG. 5 is a block diagram illustrating an apparatus for identifying electronic device, according to some embodiments of the present disclosure. As shown in FIG. 5, the apparatus includes: a sending portion 501, an acquiring portion 502 and a determining portion 503.

The sending portion 501 is configured to send, in response to receiving a power-on signal of the electronic device, a detection signal to the electronic device.

The acquiring portion 502 is configured to acquire waveform information of the detection signal.

The determining portion 503 is configured to determine a type of the electronic device according to the waveform information.

In some embodiments, the detection signal includes a square wave signal. The acquiring portion 502 is further configured to: acquire a rising edge time and/or a falling edge time of the detection signal.

Figure 6:
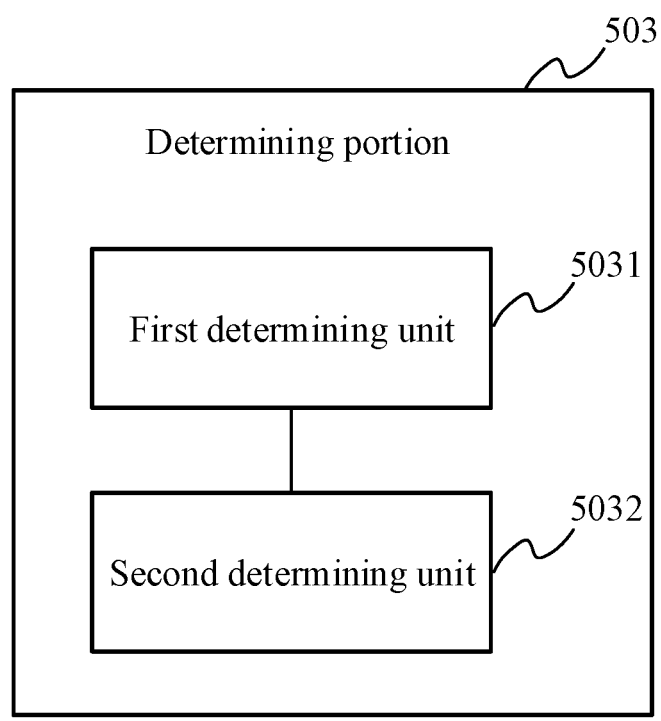
FIG. 6 is a block diagram illustrating an apparatus for identifying electronic device, according to some embodiments of the present disclosure.

FIG. 6 is a block diagram illustrating an apparatus for identifying electronic device, according to another exemplary embodiment. In some embodiments, the electronic device includes a first interface for receiving the detection signal, the first interface including a characteristic capacitor. As shown in FIG. 6, the determining portion 503 includes a first determining unit 5031 and a second determining unit 5032.

The first determining unit 5031 is configured to determine a capacity of the characteristic capacitor according to the rising edge time and/or the falling edge time. The second determining unit 5032 is configured to determine a type of the electronic device according to the capacity.

In some embodiments, the first determining unit 5031 is further configured to: determine whether the rising edge time and/or the falling edge time obtained within a preset time period is within a set threshold range; and when the rising edge time and/or the falling edge time obtained within the preset time period is within the set threshold range, acquire a capacity corresponding to the set threshold range.

In some embodiments, the second determining unit 5032 is further configured to: determine, according to preset correspondences between capacities and types of electronic devices, the type of the electronic device corresponding to the capacity.

In some embodiments, the electronic device includes a second interface which is connected to a power supply. The sending portion 501 is further configured to: send, in response to receiving a power-on signal of the electronic device through the second interface, a detection signal to the electronic device.

In a third aspect, an embodiment of the present disclosure provides an electronic device. The electronic device is used cooperatively with the terminal device provided in the first aspect.

As shown in FIG. 1, the electronic device includes: a characteristic capacitor Cp and a first pin 111 which is connected to the characteristic capacitor Cp. The first pin 111 is configured to receive a detection signal sent by the terminal device. Further, the electronic device receives the detection signal, such that the terminal device detects a type of the electronic device. In addition, the electronic device further includes: a pull-up resistor Rp; and a second pin 112 connected to the pull-up resistor Rp. The terminal device receives a power-on signal of the electronic device through the second pin 112.

In some embodiments, the electronic device includes a first interface 110 (for example, a Type C interface). The first pin 111 and the second pin 112 are both provided in the first pin 110. And, in some embodiments, the electronic device is a charging device, such as a mobile power supply and a charging back clip.

In a fourth aspect, an embodiment of the present disclosure provides a terminal device. The terminal device may be optionally a mobile phone, a tablet, a wearable device, a medical device, a vehicle-mounted device, and the like.

Figure 7:
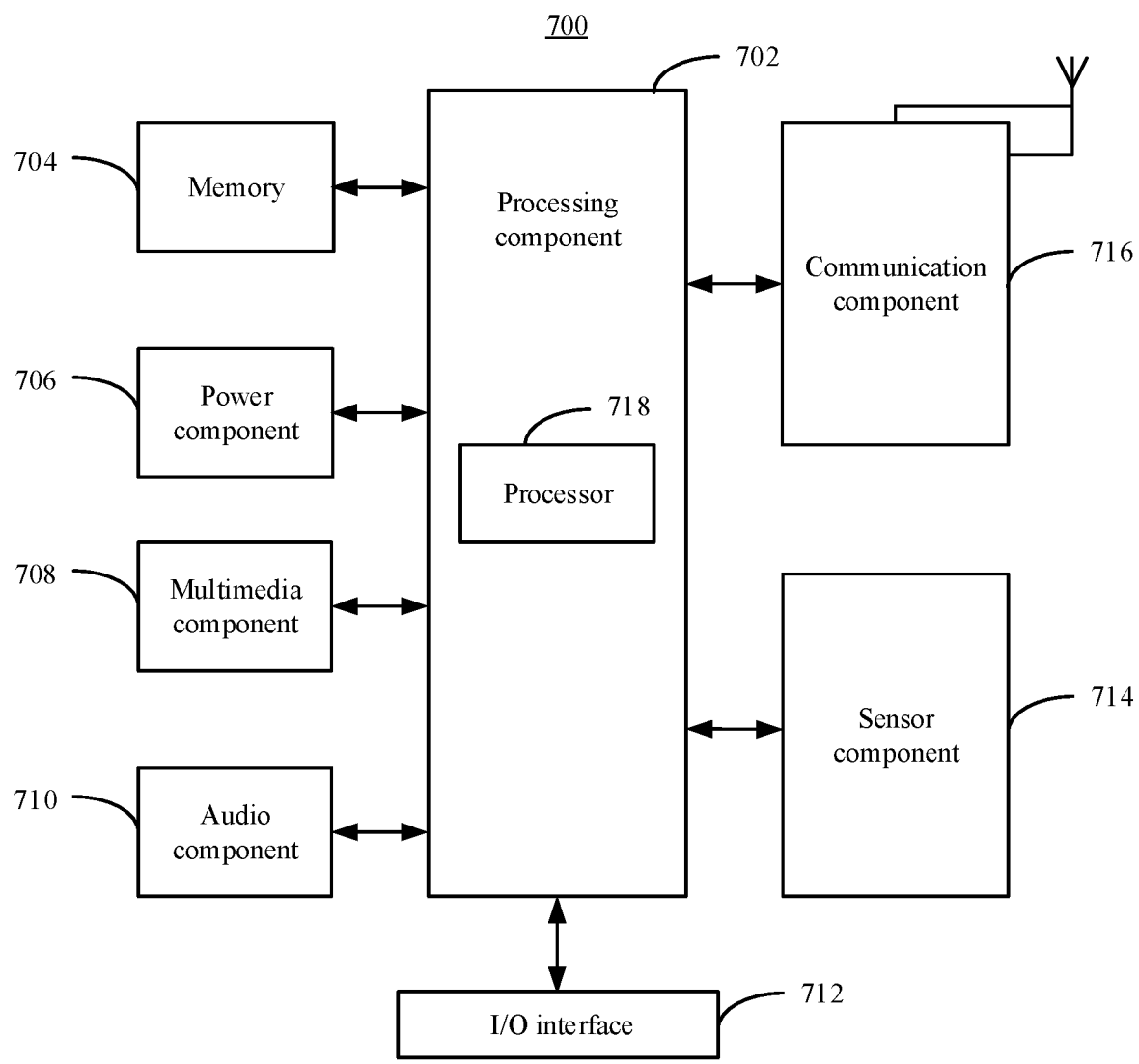
FIG. 7 is a block diagram illustrating a terminal device, according to some embodiments of the present disclosure.

The terminal device provided by the embodiment of the present disclosure includes a processor, and a memory configured to store instructions executable for the processor. The processor is configured to: send, in response to receiving a power-on signal of the electronic device, a detection signal to the electronic device; acquire waveform information of the detection signal; and determine a type of the electronic device according to the waveform information. FIG. 7 is a schematic diagram illustrating a terminal device 700, according to some embodiments of the present disclosure. For example, the terminal device 700 may be a mobile phone, a computer, a digital broadcast display device, a messaging device, a gaming console, a tablet, a medical device, exercise equipment, a personal digital assistant, and the like.

Referring to FIG. 7, the terminal device 700 may include one or more of the following components: a processing component 702, a memory 704, a power component 706, a multimedia component 708, an audio component 710, an Input/Output (I/O) interface 712, a sensor component 714, and a communication component 716.

The processing component 702 typically controls overall operations of the terminal device 700, such as operations associated with display, telephone calls, data communications, camera operations, and recording operations. The processing component 702 may include one or more processors 702 to execute instructions to perform all or part of the blocks in the above described methods. Moreover, the processing component 702 may include one or more modules which facilitate the interaction between the processing component 702 and other components. For example, the processing component 702 may include a multimedia module to facilitate the interaction between the multimedia component 708 and the processing component 702.

The memory 704 is configured to store various types of data to support the operation of the terminal device 700. Examples of such data include instructions for any applications or methods which are operated on the terminal device 700, contact data, phonebook data, messages, pictures, video, etc. The memory 704 may be implemented using any type of volatile or non-volatile memory devices, or a combination thereof, such as an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, a magnetic or optical disk.

The power component 706 provides power for various components of the terminal device 700. The power component 706 may include: a power management system, one or more power sources, and any other components associated with the generation, management and distribution of power in the terminal device 700.

The multimedia component 708 includes a display screen which provides an output interface between the terminal device 700 and the user. In some embodiments, the display screen may include a Liquid Crystal Display (LCD) and a Touch Panel (TP). In some embodiments, organic light-emitting diode (OLED) or other types of displays can be employed. If the display screen includes the TP, the display screen may be implemented as a touch screen to receive input signals from the user. The TP includes one or more touch sensors to sense touches, swipes and gestures on the TP. The touch sensors may not only sense a boundary of a touch or swipe action, but also sense a duration time and a pressure associated with the touch or swipe action. In some embodiments, the multimedia component 708 includes a front camera and/or a rear camera. The front camera and/or the rear camera may receive an external multimedia datum when the terminal device 700 is in an operation mode, such as a photographing mode or a video mode. Each of the front camera and the rear camera may be a fixed optical lens system or have focus and optical zoom capability.

The audio component 710 is configured to output and/or input audio signals. For example, the audio component 710 includes a Microphone (MIC). The MIC is configured to receive an external audio signal when the terminal device 700 is in an operation mode, such as a call mode, a recording mode, and a voice recognition mode. The received audio signal may be further stored in the memory 704 or transmitted via the communication component 716. In some embodiments, the audio component 710 further includes a speaker to output audio signals.

The I/O interface 712 provides an interface between the processing component 702 and peripheral interface modules, such as a keyboard, a click wheel, or buttons. The buttons may include, but are not limited to, a home button, a volume button, a starting button, and a locking button.

The sensor component 714 includes one or more sensors to provide status assessments of various aspects for the terminal device 700. For example, the sensor component 714 may detect an open/closed status of the terminal device 700, and relative positioning of components. For example, the component is the display and the keypad of the terminal device 700. The sensor component 714 may also detect a change in position of the terminal device 700 or of a component of the terminal device 700, a presence or absence of user contact with the terminal device 700, an orientation or an acceleration/deceleration of the terminal device 700, and a change in temperature of the terminal device 700. The sensor component 714 may include a proximity sensor which is configured to detect the presence of nearby objects without any physical contact. The sensor component 714 may also include a light sensor, such as a Complementary Metal Oxide Semiconductor (CMOS) or Charge Coupled Device (CCD) image sensor, for use in imaging applications. In some embodiments, the sensor component 714 may also include an acceleration sensor, a gyroscope sensor, a magnetic sensor, a pressure sensor, or a temperature sensor.

The communication component 716 is configured to facilitate communication, wired or wirelessly, between the terminal device 700 and other devices. The terminal device 700 may access a wireless network based on a communication standard, such as Wi-Fi, 2G, 3G, 4G, 5G or a combination thereof. In one exemplary embodiment, the communication component 716 receives a broadcast signal or broadcast associated information from an external broadcast management system via a broadcast channel. In one exemplary embodiment, the communication component 716 further includes a Near Field Communication (NFC) module to facilitate short-range communications. For example, the NFC module may be implemented based on a Radio Frequency Identification (RFID) technology, an Infrared Data Association (IrDA) technology, an Ultra-Wideband (UWB) technology, a Bluetooth (BT) technology, and other technologies.

In some embodiments, the terminal device 700 may be implemented with one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors, or other electronic elements, for performing the above described methods.

In some embodiments, there is also provided a non-transitory computer-readable storage medium including instructions, for example, the memory 704 including instructions. The above instructions are executable by the processor 718 of the terminal device 700 to complete the above described methods. For example, the non-transitory computer-readable storage medium may be a ROM, a Compact Disc Read-Only Memory (CD-ROM), a magnetic tape, a floppy disc, an optical data storage device and the like.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon is further provided. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Other embodiments of the present disclosure will be apparent to those skilled in the art from consideration of the specification and practice of the disclosure disclosed here. The present disclosure is intended to cover any variations, uses, or adaptations of the disclosure following the general principles thereof and including such departures from the disclosure as come within known or customary practice in the art. It is intended that the specification and examples be considered as exemplary only, with a true scope and spirit of the present disclosure being indicated by the following claims.

The invention claimed is:

1. A method for identifying an electronic device, applied to a terminal device, the method comprising:
   sending, in response to receiving a power-on signal of the electronic device, a detection signal to the electronic device;
   acquiring waveform information of the detection signal; and
   determining a type of the electronic device according to the waveform information,
   wherein the detection signal comprises a square wave signal, and acquiring the waveform information of the detection signal comprises;
   acquiring at least one of the rising edge time or a falling edge time of the detection signal.

2. The method of claim 1, wherein the electronic device comprises a first pin for receiving the detection signal, the first pin being connected to a characteristic capacitor, determining the type of the electronic device according to the waveform information comprises:
   determining a capacity of the characteristic capacitor according to at least one of the rising edge time or the falling edge time; and
   determining the type of the electronic device according to the capacity of the characteristic capacitor.

3. The method of claim 2, wherein determining the capacity of the characteristic capacitor according to at least one of the rising edge time or the falling edge time comprises:
   determining whether at least one of the rising edge time or the falling edge time obtained within a preset time period is within a set threshold range; and
   acquiring, when at least one of the rising edge time or the falling edge time obtained within the preset time period is within the set threshold range, the capacity of the characteristic capacitor corresponding to the set threshold range.

4. The method of claim 2, wherein determining the type of the electronic device according to the capacity of the characteristic capacitor comprises:
   determining, according to preset correspondences between capacities of characteristic capacitors and types of electronic devices, the type of the electronic device corresponding to the capacity.

5. The method of claim 1, wherein the electronic device comprises a second pin connected to a power supply, and receiving the power-on signal of the electronic device comprises:
   receiving the power-on signal of the electronic device through the second pin.

6. A mobile terminal implementing the method of claim 1, wherein the mobile terminal is configured to identify types of electronic devices based on waveforms of detection signals from the electronic devices, thereby reducing circuit complexity of an interface chip in the mobile terminal.

7. The mobile terminal of claim 6, wherein the mobile terminal is configured to identify whether the electronic device is securely connected to the mobile terminal to prevent the electronic device from being identified in a case that the electronic device and the terminal device are connected and disconnected momentarily, reduce unnecessary information transmission or information processing, and energy consumption.

8. An electronic system comprising the mobile terminal of claim 7, further comprising a plurality of electronic devices including the electronic device.

9. The electronic system of claim 8, wherein different characteristic capacitors are provided in different electronic devices.

10. The electronic system of claim 9, wherein
    the plurality of electronic devices include a charging back clip having a characteristic capacitor with a capacity of 1 µf, and a power bank having a characteristic capacitor with a capacity of 1 nF; and
    the mobile terminal stores
    a first correspondence table including correspondences between the waveform information and the types of plurality of electronic devices to facilitate the mobile terminal determining the types of the plurality of electronic devices according to the waveform information; and
    a second correspondence table including correspondences between capacities of the characteristic capacitors and the types of electronic devices to facilitate the mobile terminal determining the types of the plurality of electronic devices according to the characteristic capacitors.

11. An apparatus for identifying an electronic device, applied to a terminal device, the apparatus comprising:
a processor; and
memory storing instructions for execution by the processor to:
send, in response to receiving a power-on signal of the electronic device, a detection signal to the electronic device;
acquire waveform information of the detection signal; and
determine a type of the electronic device according to the waveform information;
wherein the detection signal comprises a square wave signal, and the processor is further configured to:
acquire at least one of a rising edge time or a falling edge time of the detection signal.

12. The apparatus of claim 11, wherein the electronic device comprises a first pin for receiving the detection signal, the first pin comprises a characteristic capacitor, and the processor is further configured to:
determine a capacity of the characteristic capacitor according to at least one of the rising edge time or the falling edge time; and
determine the type of the electronic device according to the capacity of the characteristic capacitor.

13. The apparatus of claim 12, wherein the processor is further configured to:
determine whether at least one of the rising edge time or the falling edge time obtained within a preset time period is within a set threshold range; and acquire, when at least one of the rising edge time or the falling edge time obtained within the preset time period is within the set threshold range, the capacity of the characteristic capacitor corresponding to the set threshold range.

14. The apparatus of claim 12, wherein the processor is further configured to:
determine, according to preset correspondences between capacities of characteristic capacitors and types of electronic devices, the type of the electronic device corresponding to the capacity of the characteristic capacitor.

15. The apparatus of claim 11, wherein the electronic device comprises a second pin connected to a power supply, and the processor is further configured to:
send, in response to receiving the power-on signal of the electronic device through the second pin, the detection signal to the electronic device.

16. An electronic device, cooperating with the terminal device of claim 11,
the electronic device comprising a characteristic capacitor and a first pin which is connected to the characteristic capacitor, the first pin being configured to receive the detection signal sent by the terminal device.

17. The electronic device of claim 16, further comprising a pull-up resistor, and a second pin which is connected to the pull-up resistor, the terminal device receiving the power-on signal of the electronic device through the second pin.

18. The electronic device of claim 16, wherein the electronic device is a charging device.

* * * * *